(12) United States Patent
Tang et al.

(10) Patent No.: US 7,375,549 B1
(45) Date of Patent: May 20, 2008

(54) RECONFIGURATION OF PROGRAMMABLE LOGIC DEVICES

(75) Inventors: Howard Tang, San Jose, CA (US); Ju Shen, San Jose, CA (US); San-Ta Kow, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 158 days.

(21) Appl. No.: 11/350,436

(22) Filed: Feb. 9, 2006

(51) Int. Cl.
*H03K 19/173* (2006.01)

(52) U.S. Cl. .......................... 326/38; 326/40; 714/726; 714/727

(58) Field of Classification Search .................. 326/38, 326/39
See application file for complete search history.

(56) References Cited

U.S. PATENT DOCUMENTS

| | | | |
|---|---|---|---|
| 5,548,228 A | | 8/1996 | Madurawe |
| 5,640,107 A | | 6/1997 | Kruse |
| 5,689,516 A | | 11/1997 | Mack et al. |
| 5,696,455 A | | 12/1997 | Madurawe |
| 6,028,449 A | * | 2/2000 | Schmitt ........................ 326/80 |
| 6,049,222 A | | 4/2000 | Lawman |
| 6,150,837 A | | 11/2000 | Beal et al. |
| 6,218,858 B1 | * | 4/2001 | Menon et al. ................. 326/39 |
| 6,304,099 B1 | | 10/2001 | Tang et al. |
| 6,356,107 B1 | | 3/2002 | Tang et al. |
| 6,467,009 B1 | | 10/2002 | Winegarden et al. |
| 6,538,468 B1 | | 3/2003 | Moore |
| 6,624,656 B1 | * | 9/2003 | Fox et al. ...................... 326/41 |
| 6,704,850 B1 | | 3/2004 | Reynolds |
| 6,714,041 B1 | | 3/2004 | Darling et al. |
| 6,721,840 B1 | | 4/2004 | Allegrucci |
| 6,732,263 B1 | | 5/2004 | May et al. |
| 6,774,668 B1 | | 8/2004 | Wirtz, II |
| 6,828,823 B1 | | 12/2004 | Tsui et al. |
| 6,851,047 B1 | | 2/2005 | Fox et al. |
| 6,873,177 B1 | | 3/2005 | Wennekamp et al. |
| 7,199,608 B1 | * | 4/2007 | Trimberger .................. 326/38 |
| 2005/0189962 A1 | | 9/2005 | Agrawal et al. |

OTHER PUBLICATIONS

U.S. Appl. No. 10/809,658, Howard Tang.
U.S. Appl. No. 11/243,255, Howard Tang.
U.S. Appl. No. 11/293,941, Howard Tang.

* cited by examiner

*Primary Examiner*—Vibol Tan
(74) *Attorney, Agent, or Firm*—MacPherson Kwok Chen & Heid LLP; Brent A. Folsom

(57) ABSTRACT

Improved reconfiguration techniques are provided for programmable logic devices (PLDs). For example, in accordance with an embodiment of the present invention, a programmable logic device includes a plurality of logic blocks, a plurality of input/output blocks and corresponding input/output pins, and a plurality of configuration memory cells. The configuration memory cells are adapted to store configuration data for configuration of the logic blocks and the input/output blocks. A data port is adapted to provide a clock signal to and receive configuration data from an external memory. A plurality of circuits are adapted to hold the input/output pins in a known logic state during the configuration.

17 Claims, 10 Drawing Sheets

RECONFIGURATION OF PROGRAMMABLE LOGIC DEVICES

TECHNICAL FIELD

The present invention relates generally to electrical circuits and, more particularly, to configuration (including reconfiguration) of programmable logic devices.

BACKGROUND

Programmable logic devices (PLDs), such as field programmable gate arrays (FPGAs) or complex programmable logic devices (CPLDs), can be used in a variety of applications. PLDs offer the advantage of being reprogrammable and are typically reprogrammed in the field (e.g., while remaining on circuit boards in operational environments).

However, a drawback associated with conventional PLDs is their inability to provide desired logic states (i.e., output signal values) on input/output pins while being programmed with new configuration data (i.e., reconfigured). For example, in applications where a PLD does not provide onboard non-volatile memory, it is generally necessary to load new configuration data from an external source into the onboard configuration memory of the PLD. Unfortunately, conventional PLDs typically cannot provide predictable behavior on their output pins while simultaneously loading new configuration data into onboard volatile memory.

More specifically, a conventional PLD may be in a sleep state during reconfiguration, wherein input/output pins are disabled (e.g., non-responsive to input signals while providing indeterminate output signals). Such behavior is generally unacceptable, especially in applications where the PLD is in a critical path or is used to control critical functions. Conventional PLDs can also exhibit glitches in the output signals provided on the output pins during programming and immediately after programming. Such glitches are also unacceptable in critical applications. As a result, there is a need for improved programming and configuration techniques for PLDs.

SUMMARY

In accordance with one embodiment of the present invention, a programmable logic device includes a plurality of logic blocks; a plurality of input/output blocks and corresponding input/output pins; a plurality of configuration memory cells adapted to store configuration data for configuration of the logic blocks and the input/output blocks; a data port adapted to provide a clock signal to and receive configuration data from an external memory; and a plurality of circuits adapted to hold the input/output pins in a known logic state during the configuration.

In accordance with another embodiment of the present invention, a method of reconfiguring a programmable logic device includes triggering a reconfiguration of the programmable logic device while configuration memory cells of the programmable logic device are configured with configuration data; capturing a plurality of output signal values of the programmable logic device; providing a clock signal to an external non-volatile memory; loading reconfiguration data into the configuration memory cells from the external non-volatile memory during the providing; and maintaining the output signal values during the loading.

In accordance with another embodiment of the present invention, a system includes a programmable logic device (PLD) having a plurality of configuration memory cells adapted to store configuration data; means for storing, external to the programmable logic device, configuration data for configuring or reconfiguring the programmable logic device; means for providing a clock signal from the programmable logic device to the storing means; means for loading the configuration data into the configuration memory cells from the storing means based on the clock signal; and means for maintaining PLD output signal values during loading of the configuration data.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
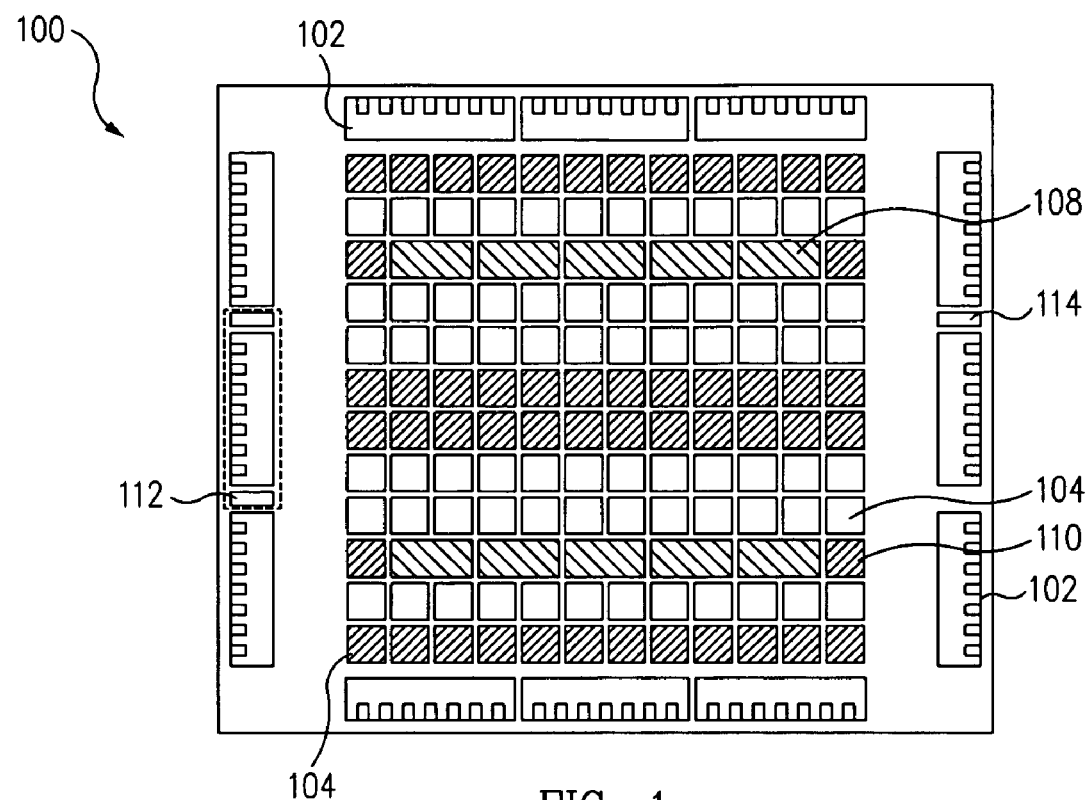
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 includes input/output (I/O) blocks 102 and programmable logic blocks 104, which are used to provide I/O functionality (e.g., one or more I/O and/or memory interface standards) and logic functionality (e.g., LUT-based logic), respectively, for PLD 100. PLD 100 also includes configuration memory (not shown explicitly) discussed further herein. PLD 100 may also include volatile memory 108 (e.g., block SRAM) separate from configuration memory and clock-related circuitry 110 (e.g., PLL circuits).

PLD 100 also includes one or more data ports 112 and/or 114, which for example may be used for programming volatile memory 108 of PLD 100. For example, data port 112 may represent a programming port such as a serial peripheral interface (SPI) interface or central processing unit (CPU) port, and may also be referred to as a peripheral data port or a sysCONFIG programming port. Data port 114 may represent, for example, a programming port such as a joint test action group (JTAG) port by employing standards such as Institute of Electrical and Electronics Engineers (IEEE) 1149.1 or 1532 standards.

Configuration data stored external to PLD 100 (for example, in external non-volatile memory) may be transferred to the configuration memory of PLD 100 upon power up or during reconfiguration of PLD 100. Non-volatile memory within PLD 100 or external to PLD 100 may also be used to provide background programming functionality for PLD 100. For example, for background programming, PLD 100 may remain in a user mode, based on the configuration data stored in configuration memory within PLD 100, while an external non-volatile memory is programmed with new configuration data (e.g., a new user defined pattern). Once the new configuration data is stored in the external non-volatile memory, this data can be transferred to the configuration memory of PLD 100 to reconfigure PLD 100, a process sometimes referred to as refresh.

As explained further herein, the refresh process can be initiated by a signal or instruction provided to data port 112 or data port 114 (e.g., pulsing data port 112 or providing a JTAG refresh instruction via data port 114). Furthermore, as explained further herein in accordance with one or more embodiments of the present invention, full control of the logical values of the output signals provided by PLD 100 during the refresh process can still be provided.

Figure 2:
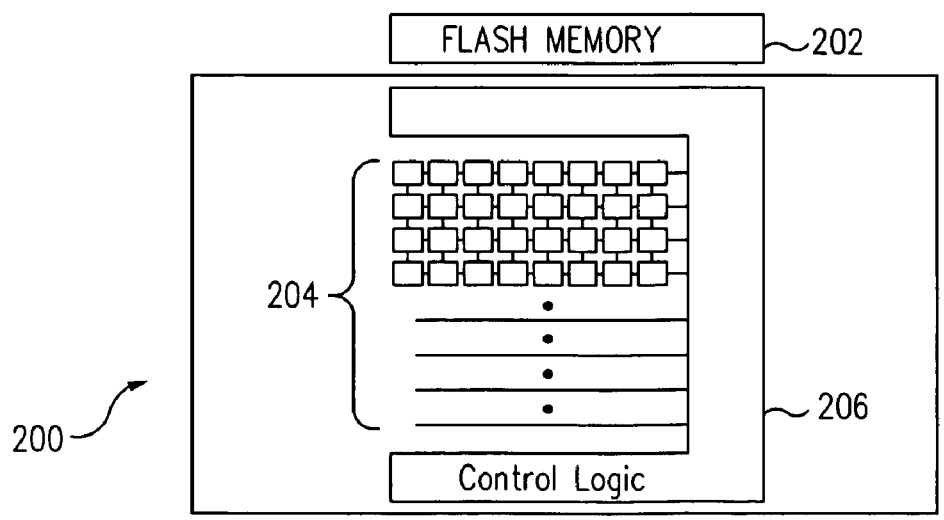
FIG. 2 shows a block diagram illustrating exemplary implementation details for the programmable logic device of FIG. 1 in accordance with an embodiment of the present invention.

As a specific example, FIG. 2 shows a block diagram illustrating a PLD 200, which provides exemplary implementation details for PLD 100 of FIG. 1 in accordance with an embodiment of the present invention. PLD 200 includes configuration memory cells 204, and control logic 206. An external non-volatile memory 202 may also be provided separately from PLD 200. It should be understood that although non-volatile memory 202 is represented as a flash memory in the exemplary embodiment of FIG. 2, other types of volatile memory or non-volatile memory (e.g., EEPROM or EECMOS) that can be reprogrammed once or repeatedly may be used for non-volatile memory 202.

Configuration memory cells 204 (e.g., volatile SRAM cells) are used in a conventional manner to store configuration data, which determines the user defined functions of PLD 200 (e.g., determines programmable functions of I/O blocks 102 and logic blocks 104). Control logic 206 controls the transfer of the configuration data from non-volatile memory 202 to configuration memory cells 204, as would be understood by one skilled in the art.

Either non-volatile memory 202 or configuration memory cells 204 may be programmed (i.e., receive and store information in its memory) to store configuration data for PLD 200, but the device functionality of PLD 200 is determined by the information stored in configuration memory cells 204. Thus, PLD 200 is configured (including reconfiguration or partial reconfiguration) when information is programmed into configuration memory cells 204.

It should also be understood, in accordance with one or more embodiments of the present invention, that configuration memory cells 204 may be programmed (including reprogrammed) via data port 112 or data port 114, depending upon the desired application or design requirements. Further details regarding programming may be found in U.S. Pat. No. 6,828,823 and U.S. Patent Publication No. 2005-0189962-A1, published Sep. 1, 2005.

In general, during programming of configuration memory cells 204 and reconfiguration of the PLD (e.g., PLD 100), it would be advantageous to continue to support system operation functions. However, conventional approaches typically provide the configuration data to the configuration memory of the PLD, while the PLD's output signals are tri-stated or held to default logical high or low values. In contrast, in accordance with one or more embodiments of the present invention, techniques are disclosed herein to provide the configuration data to the PLD and, during configuration or reconfiguration (which includes partial reconfiguration), provide desired PLD output signals that remain glitch-free during the transition from configuration to user mode of the PLD.

Figure 3:
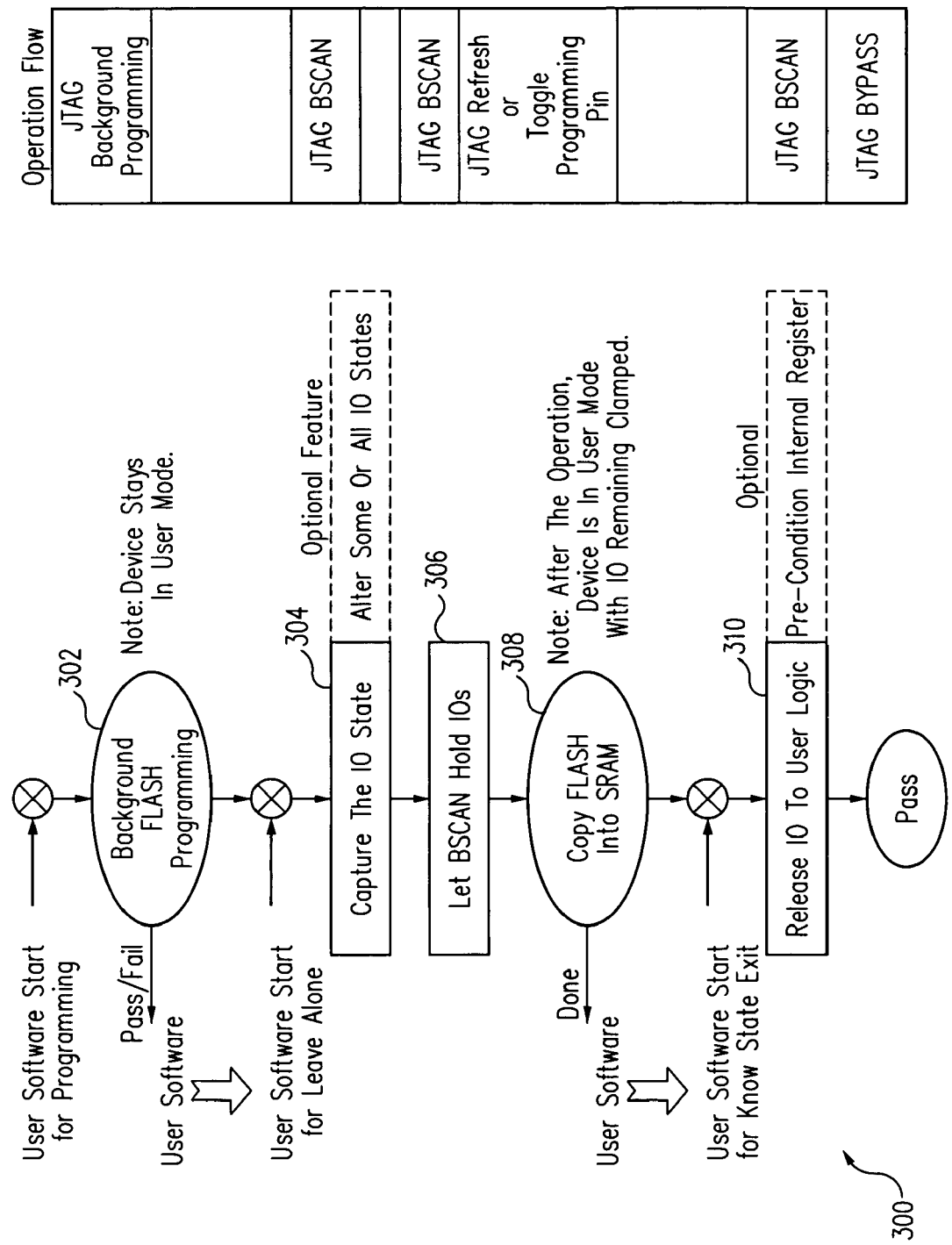
FIG. 3 shows a flowchart illustrating exemplary operations for the programmable logic device of FIG. 1 in accordance with an embodiment of the present invention.

For example, FIG. 3 shows a flowchart 300 illustrating exemplary reconfiguration operations for PLD 100 of FIG. 1 in accordance with an embodiment of the present invention. As discussed further herein, the operations illustrated in flowchart 300 may be controlled by software (e.g., user software) or hardware, as illustrated in an exemplary fashion in FIG. 3 with the corresponding operation flow for the commands and the exemplary software control indicators (user software start).

For example, Lattice Semiconductor Corporation's ispVM software is a Windows-based tool set that facilitates the programming of its PLDs. The ispVM Embedded tool generates C code that, when compiled for and executed on a wide range of embedded processors, enables the programming of the PLDs. Consequently, the ispVM software or other conventional PLD programming software can issue the programming commands directly, such as during prototyping, or generate, for example, an industry-standard Serial Vector Format (SVF) file for reconfiguration in the field. Thus, for example, the SVF file may be used to control the background programming, leave alone operation, refresh process, and the known-state exit operation (e.g., create a delay period for users to apply the vectors to precondition the registers), which are described further herein.

In reference to FIG. 3, background programming is first initiated (302), while the PLD remains in user mode operation with the current configuration data. For example, background programming of non-volatile memory 202 with the new configuration data is performed as the PLD operates based on current configuration data stored in configuration memory cells 204. The background programming may be verified prior to initiating the capture of the I/O states (e.g., current I/O values, such as logical high or low, high impedance values, or sampled) at operation 304. Optionally, the I/O states may be altered as desired by a user, as explained further herein (e.g., via input paths through boundary scan cells in the PLD by manipulating pins via an external device or through JTAG).

Using the boundary scan cells at operation 306, the I/O states are held at the captured or desired values and the PLD is reconfigured or refreshed (308) by copying the configuration data from non-volatile memory 202 to configuration memory cells 204. The reconfiguration may be initiated, for example, by pulsing or toggling data port 112 or providing a JTAG instruction (Refresh) to data port 114.

The refresh process may be verified prior to initiating the release of the I/O to the newly configured user-defined logic (operation 310). Optionally, internal registers within the I/O or other portions of the PLD may be preconditioned with data to prevent glitches from occurring during the transition to user-defined logic control of the I/O (e.g., the data for preconditioning provided via input paths through the boundary scan cells). After providing the JTAG instruction (e.g., BYPASS or EXIT_EXTEST), the PLD is now configured and operating based upon the new configuration data, with the I/O output signals under control of the newly configured user logic of the PLD. Furthermore, if the internal registers were preconditioned, the logic outputs exit in the desired state determined by the inputs to the user control logic.

The techniques illustrated may also be referred to herein by the operations of "leave alone I/O" and "known-state exit." The leave alone I/O operation refers to the ability, while the PLD is refreshed, to hold the state of the I/O output pins in a known logic state (e.g., generally operations 304 through 306 of flowchart 300). The known state may be based on the I/O values captured or based on a known system vector that is provided to set the I/O values based on user-predefined settings (dynamic leave alone). Thus, the leave alone I/O allows critical signals (e.g., reset and power enable signals provided by the PLD in a system) to not glitch and to not go active (e.g., float or provide undesired values) while the PLD is reconfigured.

The known state exit operation refers to the updating of some or all of the internal register states with predefined values (e.g., the optional portion of operation 310 of flowchart 300). The values may be provided via I/O pins and input paths through the boundary scan (BSCAN) cells (e.g., as discussed in reference to FIGS. 4 and 5). This operation is useful when the PLD logic that provides the value for the I/O pin may be in a state that would cause the I/O pin to pass through a glitch or inappropriate signal level (e.g., glitch or active level). Thus, the PLD exits to user-defined operation after reconfiguration in a known logic state.

Figure 4:
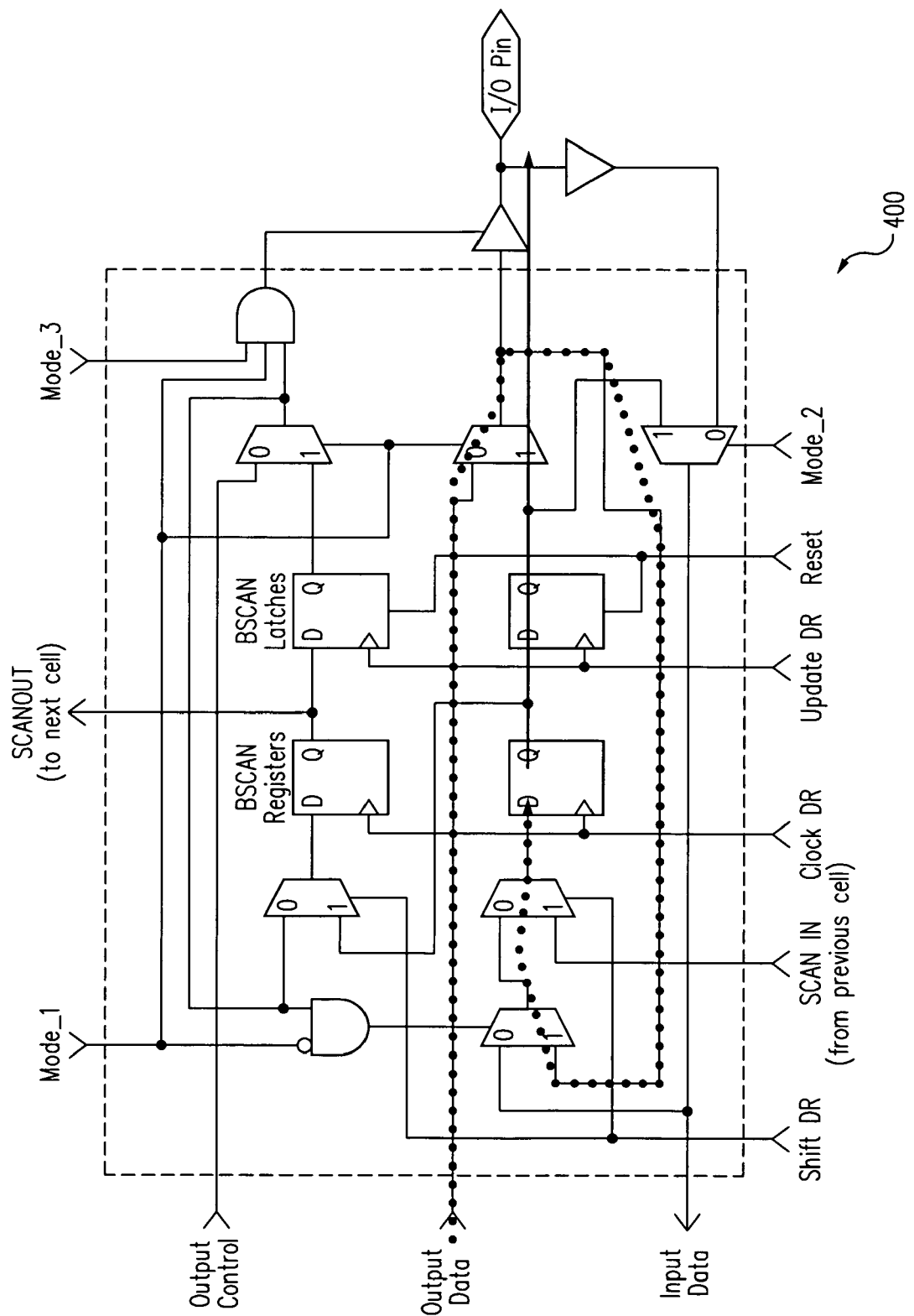
FIG. 4 shows a block diagram illustrating an exemplary circuit implementation for a portion of the programmable logic device of FIG. 1 in accordance with an embodiment of the present invention.

The leave alone operation may be implemented, for example, by using the BSCAN cells within the PLD to capture current I/O pin output states and/or optionally overlay with a custom I/O vector to set desired I/O pin output values. For example, FIGS. 4 and 5 show exemplary block diagram implementations for BSCAN circuits 400 and 500, respectively, for I/O blocks 102 of PLD 100 of FIG. 1 in accordance with an embodiment of the present invention.

BSCAN circuit 400 (BSCAN cell) illustrates that one or more BSCAN registers may be used to store the sampled I/O value to provide as an output signal via an I/O pin (e.g., using the JTAG instruction SAMPLE provided via data port 114 to place output states in BSCAN cell preload registers) and/or overlay a custom vector of user-defined values to provide as the output signal via the I/O pin (e.g., using the JTAG instruction PRELOAD). If custom vector values are provided, these can be preloaded into the PLD just prior to the refresh process (e.g., during operation 304 of flowchart 300). The I/O control can then be transferred to BSCAN circuit 400 (e.g., by using the JTAG instruction EXTEST), with the dotted path and bold arrow illustrating I/O values provided to the I/O pin based on custom vector values or captured I/O values.

BSCAN circuit 500 illustrates another exemplary circuit implementation, in accordance with an embodiment of the present invention, for a BSCAN cell. As an example, BSCAN circuit 500 shows an exemplary input path 502 via the I/O pin, where input path 502 is not blocked by BSCAN circuit 500 and is always available as an input path for providing data into the PLD (e.g., before the refresh process to provide desired I/O values or after the refresh process to precondition internal registers with desired values). Consequently, data and other information may be provided via the input path to user logic and/or registers within the PLD (e.g., to provide values for the known-state exit operation).

Figure 5:
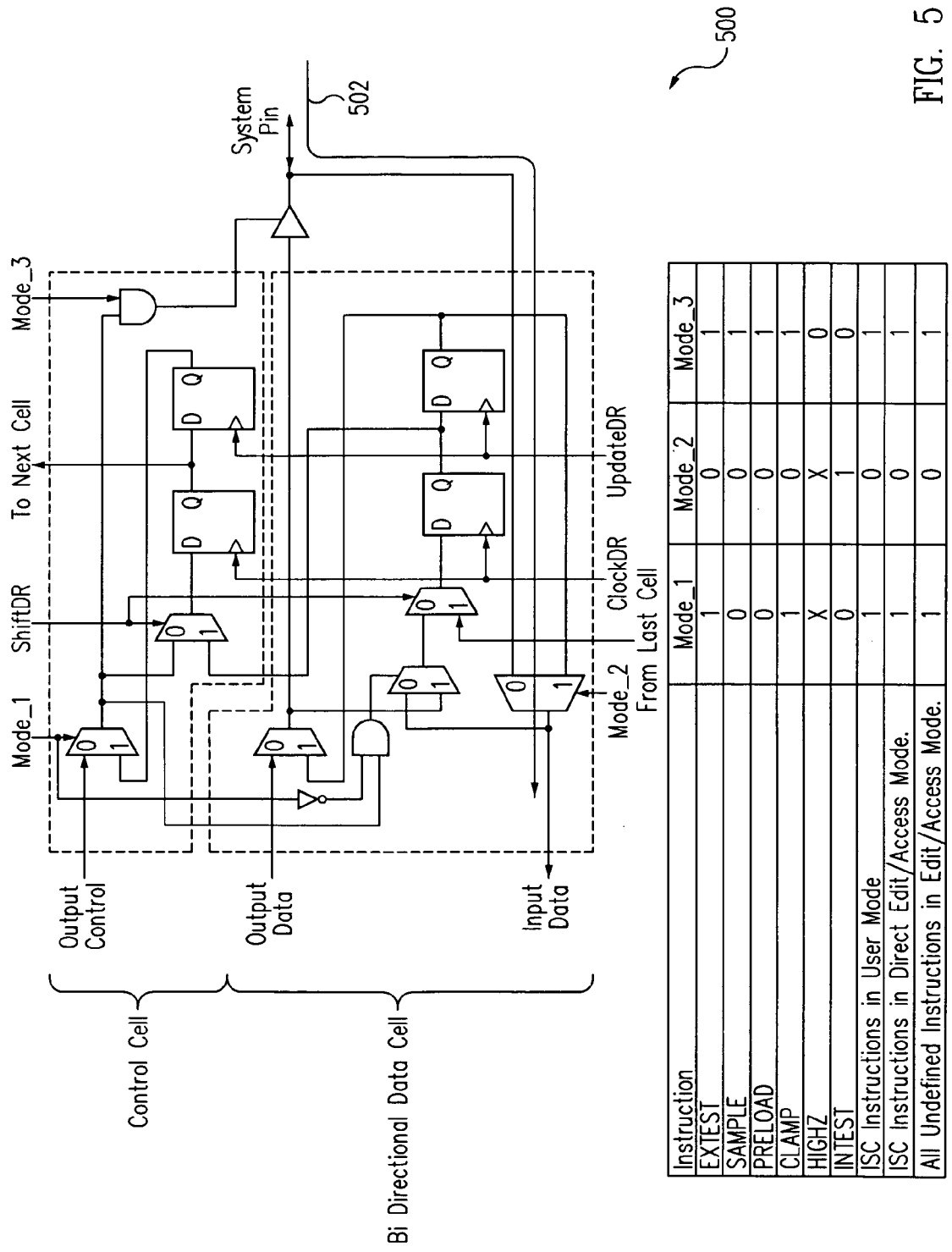
FIG. 5 shows a block diagram illustrating an exemplary circuit implementation for a portion of the programmable logic device of FIG. 1 in accordance with an embodiment of the present invention.

FIG. 5 further provides a table providing various multiplexer control signal values (e.g., for control signals Mode_1, Mode_2, and Mode_3) for corresponding JTAG instructions. Note, for example, that input path 502 is always available through a multiplexer controlled by the Mode_2 control signal for the exemplary JTAG instructions, except for the JTAG INTEST instruction. Further additional details regarding exemplary BSCAN circuits and operation may be found, for example, in U.S. Pat. Nos. 6,304,099 and 6,356,107.

Figure 6:
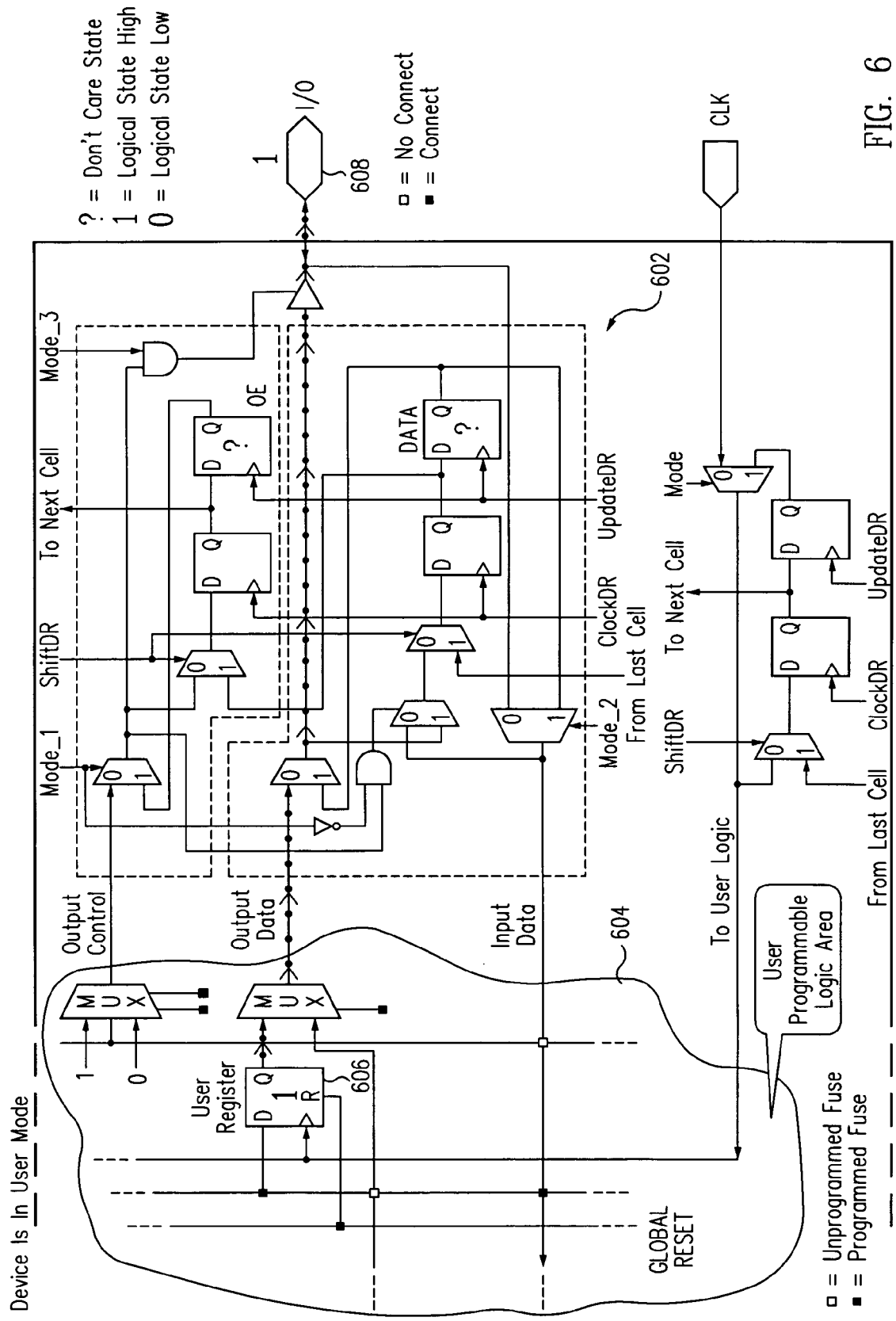
FIGS. 6-8 show block diagrams illustrating exemplary operations associated with a reconfiguration for the programmable logic device of FIG. 1 in accordance with an embodiment of the present invention.
Figure 7:
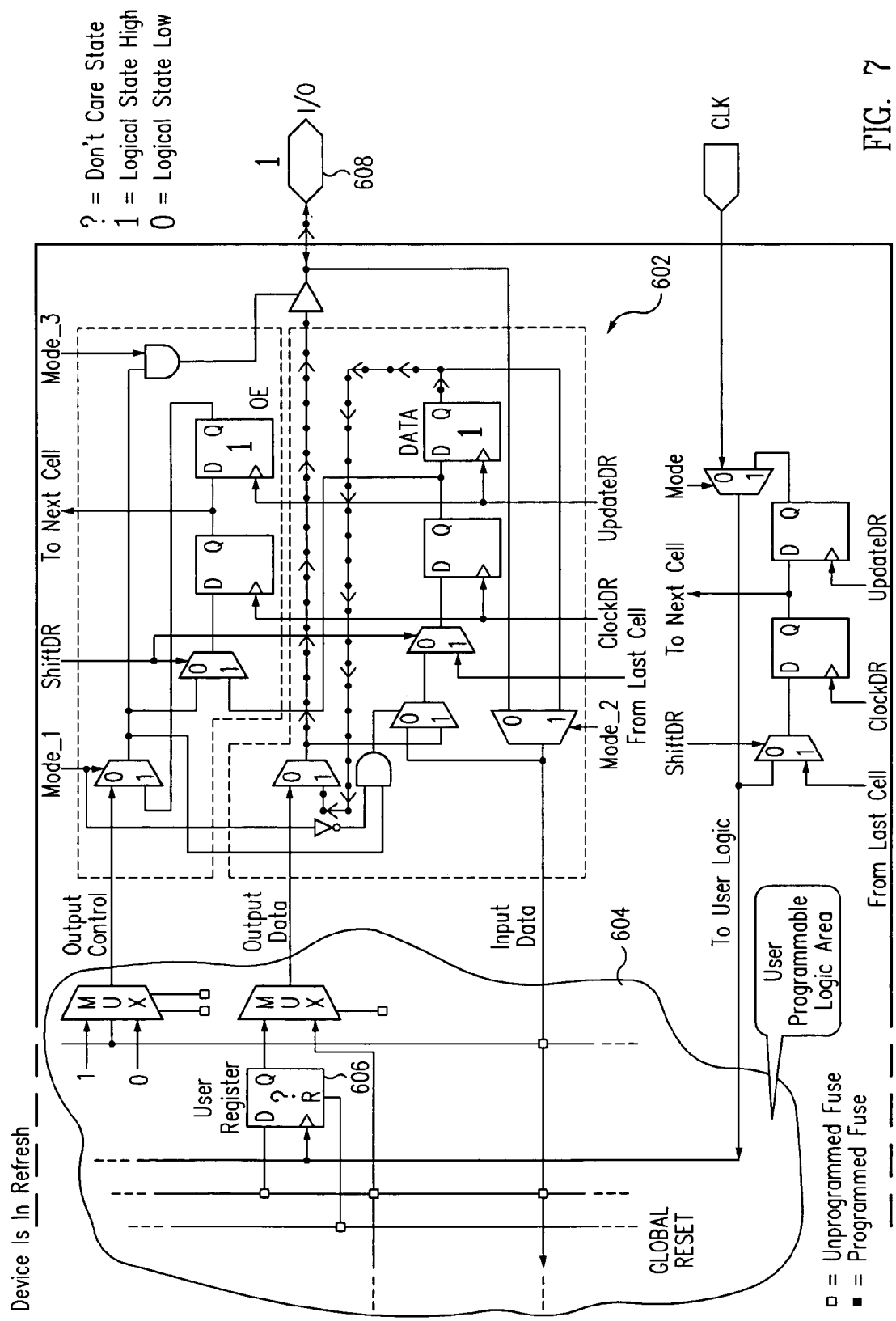
Figure 8:
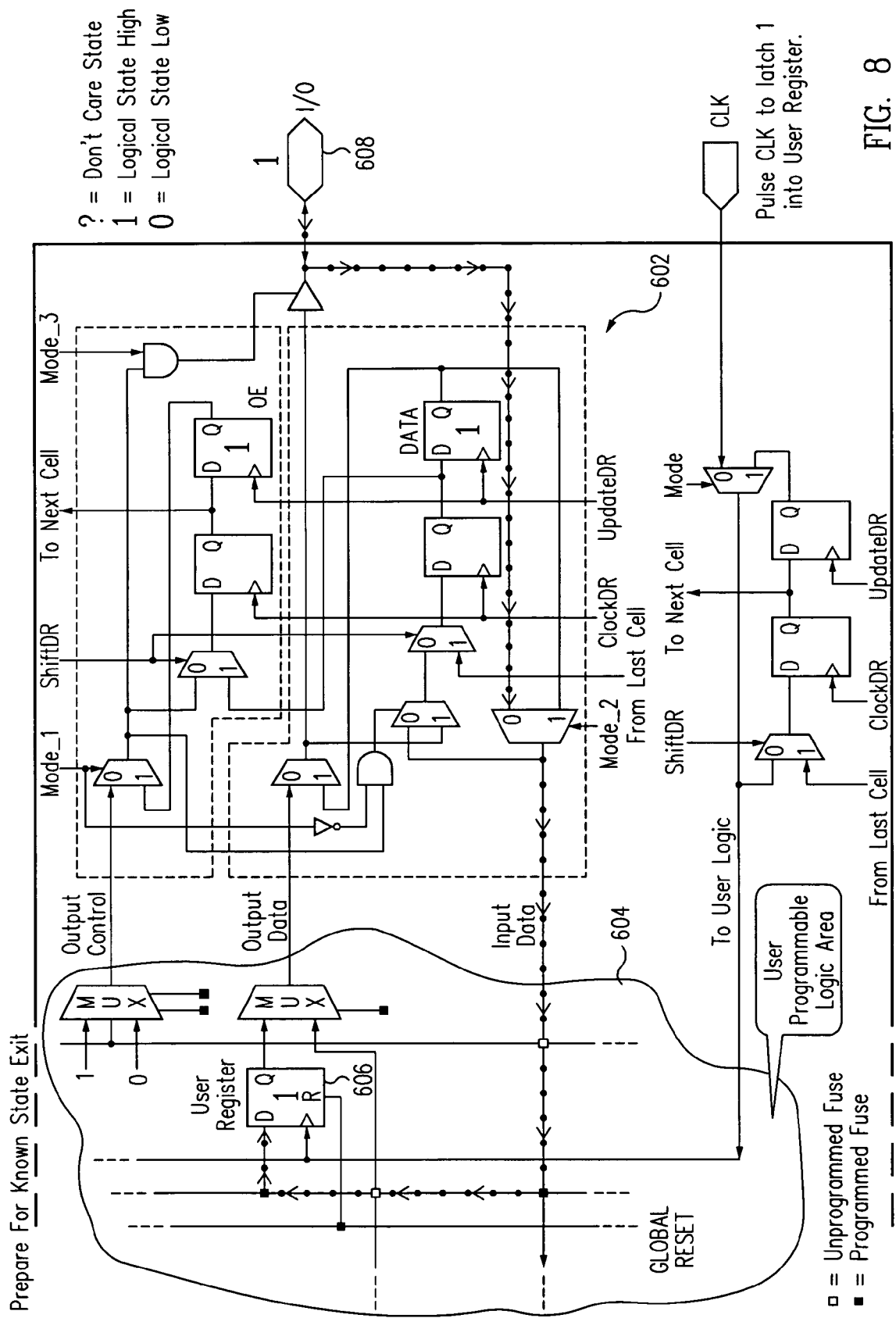

FIGS. 6-8 show block diagrams illustrating exemplary operations associated with a reconfiguration for PLD 100 of FIG. 1 in accordance with an embodiment of the present invention. Specifically, FIGS. 6-8 show an exemplary BSCAN circuit 602 (e.g., similar to BSCAN circuit 500) and a portion of a user programmable logic area 604 of PLD 100.

For example, FIG. 6 shows PLD 100 operating in a user mode of operation prior to the refresh operation. The logical states stored in BSCAN circuit 602 may be unknown (or don't care state as indicated by the question mark) and a user register 606 within logic area 604 may store a logical high value (i.e., a "1"), which user register 606 provides to an I/O pin 608, as shown by the dotted path. It should also be noted that some fuses (e.g., configuration memory cells 204) may be programmed and others may not be programmed within logic area 604, as shown.

FIG. 7 shows PLD 100 during the refresh process. For this example, BSCAN circuit 602 has captured and maintained the logical high value on I/O pin 608 (as shown by the exemplary dotted path), while logic area 604 is being programmed. Thus, during the refresh operation, the fuses within logic area 604 are at some point in an un-programmed state. For example, if the fuse is for a connection, then an un-programmed fuse means no connection.

Furthermore, user register 606 in logic area 604 may not be accessible and may store an unknown value, as shown in FIG. 7. For example, a clock signal provided to user register 606 via a clock pin (CLK) may not be externally held low to maintain the logical high value in user register 606 during the refresh operation. As another example, if the fuse connecting the reset (R) terminal of user register 606 to a global reset signal is programmed, the logical high value stored in user register 606 may be reset to a logical low value when the global reset signal is asserted during the refresh operation.

Alternatively as an example, if the global reset signal is hardwired to the reset terminal of user register 606 and the global reset signal is asserted during the refresh process, then user register 606 will store a logical low value rather than the desired logical high value. Consequently, the known-state exit operation would be required to restore the logical high value in user register 606 and avoid output signal glitches when releasing control of the I/O pin to the new user-defined logic.

FIG. 8 shows PLD 100 after the refresh process and with a known-state exit. User register 606 within logic area 604 has been preconditioned (i.e., preloaded) with a desired logical high value, as shown by the dotted input path, so that the logical high value on I/O pin 608 is maintained glitch-free when user mode of operation resumes. This is possible because the appropriate fuses within logic area 604 have been programmed by the refresh process to provide the proper connections to access user register 606 within logic area 604. Consequently, before transitioning to the user mode of operation and releasing control of I/O pin 608 to the user-defined logic, the appropriate value may be provided via BSCAN circuit 602 to user register 606 within logic area 604. User register 606, in turn, provides the appropriate value to I/O pin 608 when the user mode of operation resumes.

As previously discussed, configuration data can be provided to PLD 100 from non-volatile memory 202 external to PLD 100. As will be further discussed herein, the configuration and reconfiguration of PLD 100 can be performed in accordance with various approaches.

In one approach, configuration data may be loaded into configuration memory of PLD 100 from an external non-volatile memory through a data port while I/O pins are held at desired logic states by bus keeper circuits. In another approach, configuration data may be loaded into configuration memory of PLD 100 from an external non-volatile memory through a data port while I/O pins are held at desired logic states by boundary scan cells in response to JTAG instructions received at I/O pins configured to operate as a JTAG port. In another approach, configuration data may be loaded into configuration memory of PLD 100 from an external non-volatile memory through a data port while I/O pins are held at desired logic states by boundary scan cells in response to JTAG instructions received at a dedicated JTAG port.

Figure 9:
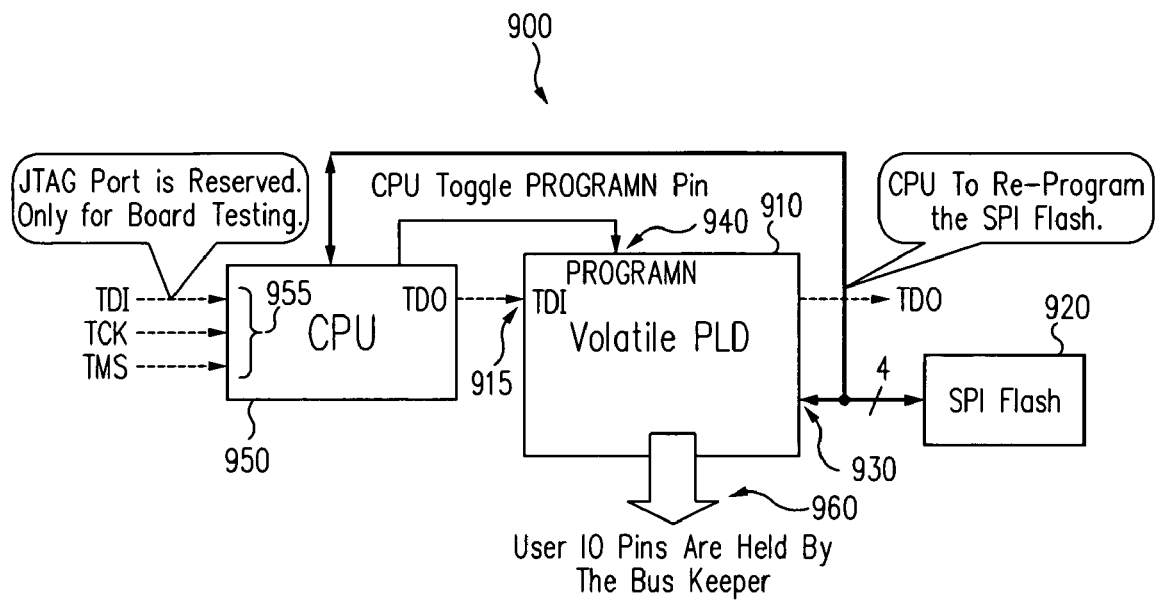
FIG. 9 shows a block diagram illustrating a programmable logic device undergoing a reconfiguration with I/O pins held by bus keeper circuits in accordance with an embodiment of the present invention.

FIG. 9 shows a block diagram 900 illustrating a PLD 910 (for example, PLD 100) undergoing a reconfiguration with I/O pins held by bus keeper circuits in accordance with an embodiment of the present invention.

As illustrated, a non-volatile memory 920 (for example, a flash memory implemented with a SPI interface) is in communication with PLD 910 through a user-configurable programming port 930 such as a sysCONFIG programming port configured as a serial peripheral interface (SPI) port. An external processor 950 (e.g., a CPU) is in communication with PLD 910 through a programming pin 940, and may also be in communication with non-volatile memory 920 to program and reprogram configuration data into non-volatile memory 920 (i.e., to perform background programming). Optionally, non-volatile memory 920 may be provided as part of processor 950. PLD 910 and processor 950 may include optional dedicated JTAG ports 915 and 955, respectively, which are not used in the embodiment of FIG. 9. PLD 910 also includes a plurality of I/O pins 960 associated, for example, with I/O blocks 102, which can be configured to provide output signal values (i.e., logic states) and/or new input signal values during operation of PLD 910.

Figure 10:
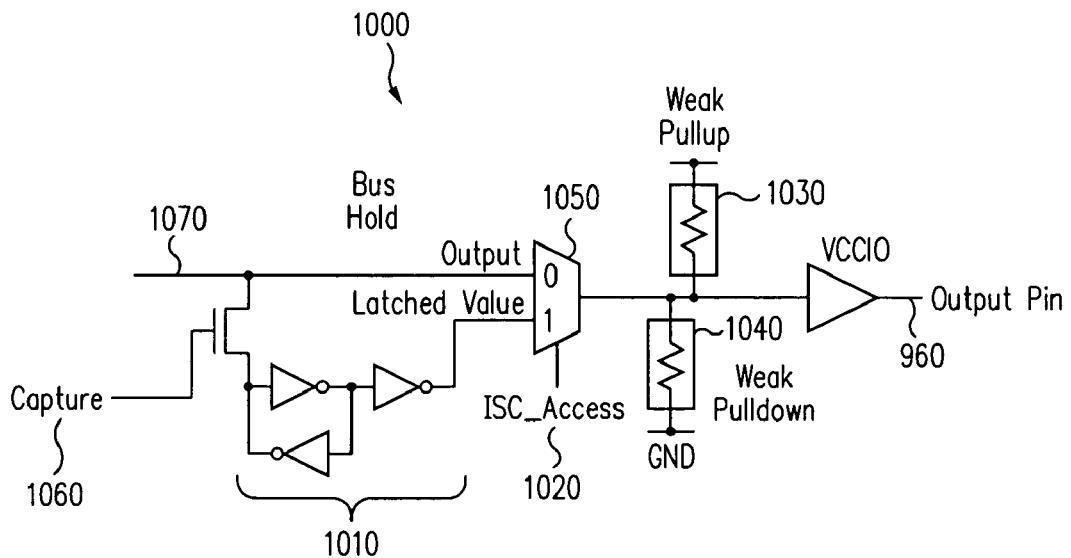
FIG. 10 shows a block diagram illustrating an exemplary circuit implementation for a bus keeper circuit of the programmable logic device of FIG. 9 in accordance with an embodiment of the present invention.

FIG. 10 shows a block diagram illustrating an exemplary circuit implementation for a bus keeper circuit 1000 for PLD 910 in accordance with an embodiment of the present invention. PLD 910 can include, for example, bus keeper circuits 1000 for each I/O pin of I/O pins 960.

When PLD 910 is operated in user mode, a logic state value is provided to output bus 1070 from logic blocks of PLD 910 (for example, programmable logic blocks 104) and passed through multiplexer 1050 to an associated I/O pin 960. Latch 1010 captures the logic state presently provided to I/O pin 960 when capture signal 1060 is asserted. As a result, when PLD 910 enters programming mode (for example, in response to processor 950 toggling programming pin 940), ISC_Access signal 1020 can be asserted, causing the logic state of latch 1010 to be provided to an associated I/O pin 960.

As illustrated, bus keeper circuit 1000 further includes a weak pullup resistor 1030 as well as a weak pulldown resistor 1040. It will be appreciated that resistors 1030 and 1040 permit bus keeper circuit 1000 to maintain logical high or logical low states at I/O pin 960 during programming mode. However, the use of resistors 1030 and 1040 also permits the latched logic state provided by latch 1010 to be overridden by external signals driven into I/O pin 960 if desired in order to, for example, precondition registers in a logic area of PLD 910 to support the known state exit operation previously described herein. In this regard, it will be appreciated that, in various embodiments, output pin 960 of bus keeper circuit 1000 may be connected with input path 502 of FIG. 5 previously described herein.

Table 1 below illustrates exemplary operations associated with the reconfiguration of PLD 910 in FIG. 9 in accordance with an embodiment of the present invention.

TABLE 1

| | | | NDR Flow | | | |
|---|---|---|---|---|---|---|
| | | Procedures | Non-JTAG Flow (without soft-IP) | | | |
| | Steps | (Set CFGx to SPI mode or others) | User IO | sysCONFIG | User Registers | EBR |
| 1 | POR | Power Up Device To SPI Mode. | Tri-State | Unused Dual-purpose IO's Tri-State. SPI interface active | Reset | Unknown |
| 2 | Configuration | Boot from SPI Flash. The NDR bit is set to 1. | | | | Initialized |
| 3 | Wake-UP | Enter User Mode | User Mode | Dual-purpose Pins are user IO's. SPI interface Inactive. | User Mode | User Mode |
| 4 | Re-Program SPI to new pattern | CPU Re-Program the SPI Flash directly. | | | | |
| 5 | Re-Configure the PLD | CPU toggle PROGRAMN pin Clear All Configure the device by the bitstream in the SPI Flash | Outputs = latches. Inputs remain | SPI interface active, others Tri-Stated. | Reset | Unknown Initialized |

TABLE 1-continued

| | | NDR Flow | | | | |
|---|---|---|---|---|---|---|
| | | Procedures | Non-JTAG Flow (without soft-IP) | | | |
| Steps | | (Set CFGx to SPI mode or others) | User IO | sysCONFIG | User Registers | EBR |
| 6 | Wake Up | Use the user clock to stage the wake-up sequence. Keep the GOE assert. | active. | SPI interface inactive. Others Tri-Stated. | User Mode | User Mode |
| 7 | Known State Exit | Clock the user registers to the Known State. | | | | |
| 8 | Device In User Mode | De-assert the GOE to release the IO's from latches to user logic. | User Mode | Dual-purpose pin are user IO's. SPI interface inactive. | | |

Turning now to the steps of Table 1, a power-on reset (POR) operation is initially performed (step 1) and configuration data is loaded from non-volatile memory 920 into configuration memory of PLD 910 (step 2). During these operations, I/O pins 960 are tri-stated and programming port 930 operates as an SPI interface.

PLD 910 then enters a user mode wherein I/O pins 960 operate in accordance with the configuration data loaded into PLD 910 (step 3). If it is desired to reconfigure PLD 910, then processor 950 may reprogram non-volatile memory 920 with new configuration data (step 4). Processor 950 then reconfigures PLD 910 (step 5) by toggling programming pin 940 of PLD 910, clearing the configuration memory of PLD 910, and loading the new configuration data from non-volatile memory 920 into the configuration memory of PLD 910 through programming port 930. During the reconfiguration process, the output signal values (i.e., logic states) of I/O pins 960 are maintained by bus keeper circuits 1000 which operate as previously described.

Following the reconfiguration of PLD 910, a staged wake up process (step 6) and, if desired, known state exit process (step 7) are performed while logic states of I/O pins 960 continue to be maintained by bus keeper circuits 1000. During the known state exit process, external signals may be optionally driven into I/O pins 960 to override bus keeper circuits 1000 and precondition registers of PLD 910. PLD 910 then returns to user mode wherein I/O pins 960 operate in accordance with the new configuration data (step 8).

Figure 11:
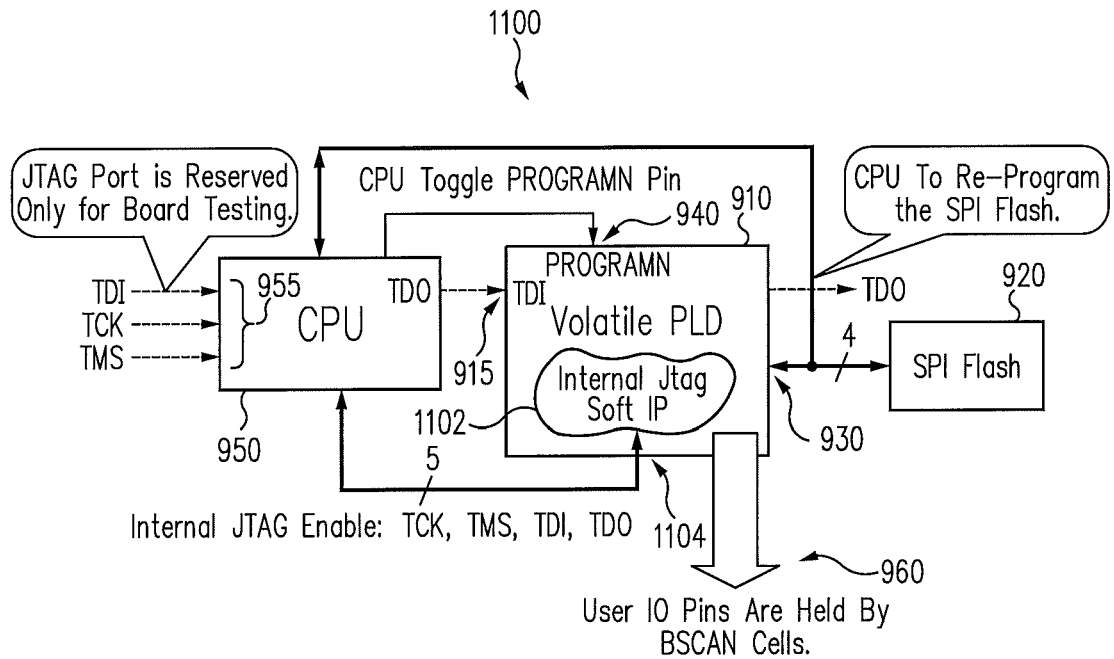
FIG. 11 shows a block diagram illustrating a programmable logic device undergoing a reconfiguration with I/O pins held by boundary scan cells in accordance with an embodiment of the present invention.

FIG. 11 shows a block diagram illustrating PLD 910 undergoing a reconfiguration with I/O pins held by boundary scan cells in accordance with an embodiment of the present invention. As illustrated, non-volatile memory 920 is in communication with PLD 910 through user-configurable programming port 930.

External processor 950 is in communication with non-volatile memory 920 to program and reprogram configuration data into non-volatile memory 920. Processor 950 is further in communication with PLD 910 through programming pin 940, as well as through a plurality of I/O pins 1104 associated, for example, with I/O blocks 102, which are configured to emulate a JTAG interface. PLD 910 is implemented (e.g., programmed) to include a soft IP core 1102 to provide internal JTAG functionality at I/O pins 1104.

PLD 910 and processor 950 may include optional dedicated JTAG ports 915 and 955, respectively, which are not used in the embodiment of FIG. 11. PLD 910 also includes I/O pins 960 which can be configured to provide output signal values during operation of PLD 910. In one embodiment, soft IP core 1102 can provide additional functionality for multiplexing various I/O pins of PLD 910 to operate as I/O pins 960 or I/O pins 1104.

Table 2 below illustrates exemplary operations associated with the reconfiguration of PLD 910 in FIG. 11 in accordance with an embodiment of the present invention.

TABLE 2

| | | NDR Flow | | | | |
|---|---|---|---|---|---|---|
| | | Procedures | Non-JTAG Flow (without soft-IP) | | | |
| | Steps | (Set CFGx to SPI mode or others) | User IO | sysCONFIG | User Registers | EBR |
| 1 | POR | Power Up Device To SCM Mode. | Tri-State | Unused Dual-purpose IO's Tri-State. SPI interface active | Reset | Unknown Initialized |
| 2 | Configuration | Boot up from SPI Flash. | | | | |
| 3 | Wake-UP | Enter User Mode | User Mode | Dual-purpose Pins are user IO's. SPI interface Inactive. | User Mode | User Mode |
| 4 | Re-Program SPI to new pattern | CPU Re-Program the SPI Flash directly. | | | | |
| 5 | Capture IO State Into BSCAN Cells | Use JTAG SAMPLE instruction via soft-IP. | | | | |
| 6 | Preload The BSCAN Cells | Use JTAG PRELOAD instruction via soft-IP. | | | | |
| 7 | Re-Configure the PLD | CPU Toggle PROGRAMN pin. Clear All Configure the device through the bitstream in the SPI Flash. | Outputs governed by BSCAN. | SPI interface active, others Tri-Stated. | Reset | Unknown Initialized |

TABLE 2-continued

NDR Flow

| | | Non-JTAG Flow (without soft-IP) | | | |
|---|---|---|---|---|---|
| Steps | Procedures (Set CFGx to SPI mode or others) | User IO | sysCONFIG | User Registers | EBR |
| 8 Wake-Up | Use the user clock to stage the wake-up sequence. Keep the GOE assert. | Inputs remain active. | | User Mode | User Mode |
| 9 Known State Exit | Clock the user registers to the Known State. | | | | |
| 10 Device In User Mode | De-assert the GOE to release the IO's from latches to user logic. | User Mode | Dual-purpose pins are user IO's. SCM interface inactive. | | |

Turning now to the steps of Table 2, a power-on reset (POR) operation is initially performed (step 1) and configuration data is loaded from non-volatile memory 920 into configuration memory of PLD 920 (step 2). During these operations, I/O pins 960 are tri-stated and programming port 930 operates as an SPI interface.

PLD 910 then enters a user mode wherein I/O pins 960 operate in accordance with the configuration data loaded into PLD 910 (step 3). If it is desired to reconfigure PLD 910, then processor 950 may reprogram non-volatile memory 920 with new configuration data (step 4). The logic states of I/O pins 960 are captured (step 5) and boundary scan cells are preloaded (step 6) in response to JTAG instructions supported by soft IP core 1102.

Processor 950 then reconfigures PLD 910 (step 7) by toggling programming pin 940 of PLD 910, clearing the configuration memory of PLD 910, and loading the new configuration data from non-volatile memory 920 into the configuration memory of PLD 910 through programming port 930. During the reconfiguration process, the output signal values of I/O pins 960 are maintained by boundary scan cells.

Following the reconfiguration of PLD 910, a staged wake up process (step 8) and an optional known state exit process (step 9) are performed while logic states of I/O pins 910 continue to be maintained by boundary scan cells. PLD 910 then returns to user mode wherein I/O pins 960 operate in accordance with the new configuration data (step 10).

Figure 12:
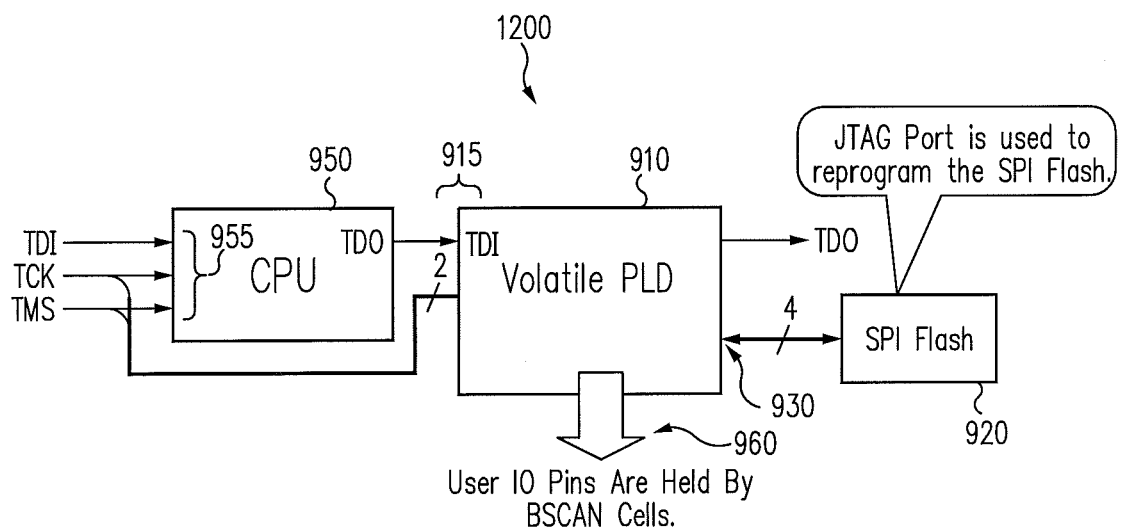
FIG. 12 shows a block diagram illustrating a programmable logic device undergoing a reconfiguration using a dedicated JTAG port and having I/O pins held by boundary scan cells in accordance with an embodiment of the present invention.

FIG. 12 shows a block diagram 1200 illustrating PLD 910 undergoing a reconfiguration using a dedicated JTAG port and having I/O pins held by boundary scan cells in accordance with an embodiment of the present invention. As illustrated, non-volatile memory 920 is in communication with PLD 910 through user-configurable programming port 930. Configuration data can be programmed and reprogrammed into non-volatile memory 920 through JTAG interface 915 of PLD 910.

PLD 910 also includes I/O pins 960 which can be configured to provide output signal values during operation of PLD 910. External processor 950 is in communication with PLD 910 through dedicated JTAG interface 915 of PLD 910. As illustrated, processor 950 also includes dedicated JTAG interface 955 to support dedicated JTAG functionality and is in communication with JTAG interface 915 of PLD 910.

Table 3 below illustrates exemplary operations associated with the reconfiguration of PLD 910 in FIG. 12 in accordance with an embodiment of the present invention.

TABLE 3

NDR Flow

| | | | Mixed (non-JTAG and JTAG) Flow | | | |
|---|---|---|---|---|---|---|
| Steps | | Procedures (Set CFGx to SPI mode or others) | User IO | sysCONFIG | User Registers | EBR |
| 1 | POR | Power Up Device To SCM Mode | Tri-State | Unused Dual-purpose IO's Tri-State. SPI interface active | Reset | Unknown |
| 2 | Configuration | Boot from SPI Flash. | | | | Initialized |
| 3 | Wake-UP | Enter User Mode | User Mode | Dual-purpose Pins are user IO's. SPI interface Inactive. | User Mode | User Mode |
| 4 | Re-Program SPI to new pattern | Re-Program the SPI Flash through the JTAG SPI_PROGRAM instruction | | | | |
| 5 | Capture IO State Into BSCAN Cells | Use JTAG SAMPLE instruction | | | | |
| 6 | Preload The BSCAN Cells | Use JTAG PRELOAD instruction | | | | |
| 7 | Re-Configure the PLD | Use JTAG Refresh instruction to trigger the re-configuration. Clear All Configure the device through the bitstream in the SPI Flash. | Outputs governed by BSCAN. Inputs remain active. | SPI interface active, others Tri-State. | Reset | Unknown Initialized |
| 8 | Wake-Up | Use the user clock to stage the wake-up sequence. Keep the GOE assert. | | User Mode | User Mode | |

TABLE 3-continued

| | | NDR Flow | | | | |
|---|---|---|---|---|---|---|
| | | Procedures | Mixed (non-JTAG and JTAG) Flow | | | |
| Steps | | (Set CFGx to SPI mode or others) | User IO | sysCONFIG | User Registers | EBR |
| 9 | Known State Exit | Clock the user registers to the Known State. | | | | |
| 10 | Device In User Mode | De-assert the GOE to release the IO's from latches to user logic. | User Mode | Dual-purpose pins are user IO's. SCM interface inactive. | | |

Turning now to the steps of Table 3, a power-on reset (POR) operation is initially performed (step 1) and configuration data is loaded from non-volatile memory 920 into configuration memory of PLD 910 (step 2). During these operations, I/O pins 960 are tri-stated and programming port 930 operates as an SPI interface.

PLD 910 then enters a user mode wherein I/O pins 960 operate in accordance with the configuration data loaded into PLD 910 (step 3). If it is desired to reconfigure PLD 910, then non-volatile memory 920 may be reprogrammed with new configuration data through appropriate information provided to JTAG interface 915, such as a JTAG SPI_PROGRAM instruction (step 4). The logic states of I/O pins 960 are captured (step 5) and boundary scan cells are preloaded (step 6) in response to JTAG instructions.

In response to a JTAG instruction (for example, a JTAG Refresh instruction) received by JTAG interface 915 of PLD 910, reconfiguration of PLD 910 is triggered, configuration memory of PLD 910 is cleared, and new configuration data is loaded from non-volatile memory 920 into the configuration memory of PLD 910 through programming port 930 (step 7). During the reconfiguration process, the output signal values of I/O pins 960 are maintained by boundary scan cells.

Following the reconfiguration of PLD 910, a staged wake up process (step 8) and an optional known state exit process (step 9) are performed while logic states of I/O pins 960 continue to be maintained by boundary 960 operating in accordance with the new configuration data (step 10).

Figure 13:
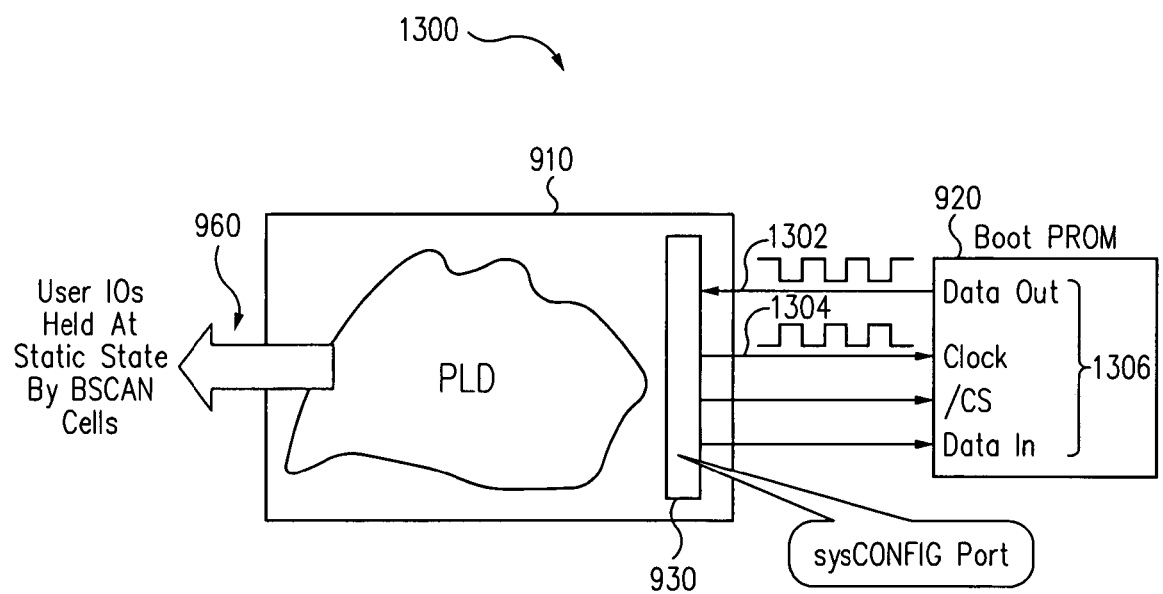
FIG. 13 shows a block diagram illustrating the programmable logic device of FIG. 1 providing a clock signal while undergoing a reconfiguration in accordance with an embodiment of the present invention.

FIG. 13 shows a block diagram 1300 illustrating PLD 910 providing a clock signal while undergoing a reconfiguration in accordance with an embodiment of the present invention. Non-volatile memory 920 is illustrated in communication with PLD 910 through programming port 930 providing support for SPI signals 1306 between PLD 910 and non-volatile memory 920. I/O pins 960 can be configured to provide output data during operation of PLD 910.

During reconfiguration of PLD 910, configuration data 1302 can be provided to PLD 910 through programming port 930 (i.e., sysCONFIG port). Advantageously, PLD 910 can continue to provide a clock signal 1304 to non-volatile memory 920 while configuration data 1302 is simultaneously loaded into configuration cells of PLD 910. In accordance with one or more of the previously discussed embodiments, boundary scan cells or bus keeper circuits of PLD 910 can maintain the states of I/O pins 960 while configuration data 1302 is loaded in the embodiment of FIG. 13.

In one embodiment, PLD 910 can be implemented to support a master mode and a slave mode at programming port 930. For example, in master mode (i.e., an SPI mode), PLD 910 can provide a chip select signal to non-volatile memory 920 and provide clock signal 1304 (i.e., a programming clock) to clock an appropriate read opcode to non-volatile memory 920 and thereafter clock (i.e., synchronize) the loading of configuration data from non-volatile memory 920 to configuration memory cells of PLD 910. Clock signal 1304 may be provided by a dedicated configuration clock of PLD 910 which is driven by a free running oscillator (not shown) of PLD 910. In slave mode (i.e., a CPU mode), the loading of configuration data can be clocked by a programming clock received by PLD 910 from processor 950. The master or slave mode of PLD 910 can be determined by the setting of one or more configuration mode pins of PLD 910, such as a CFGX pin of data port 910 as identified in Table 4 below which identifies the behavior of a plurality of pins of PLD 100 of FIG. 1 in accordance with an embodiment of the present invention.

TABLE 4

| Programming Mode | | | Non-JTAG | | | | Comments |
|---|---|---|---|---|---|---|---|
| | | | Action | | | | |
| Step 1 | | | POR and Boot Up. | | | POR and Boot Up. | Device in User Mode. |
| Step 2 | | | X_PROGRAM_ENABLE | | | X_PROGRAM_ENABLE | SAMPLE/PRELOAD optional. |
| Step 3 | | | | | | Toggle PROGRAMN in | REFRESH is a JTAG instruction |
| | Personality Latches | I/O States In Edit Mode | Type | SCM | PCM | SPI | Non-JTAG Programming Mode is determined by the CFGx setting. |
| | | | User IO's | | | | |

TABLE 4-continued

| Programming Mode | | | Non-JTAG | | | | Comments |
|---|---|---|---|---|---|---|---|
| | | Yes | BSCAN | I/O | BSCAN sysCONFIG | BSCAN | BSCAN | Outputs governed by BSCAN. |
| CCLK | Master | NA | Tri-State | I/O | Output | Output | Output | CCLK is output. |
| | Slave | NA | Tri-State | I/O | Input | Input | Manufact. | CCLK is input. |
| DONE | | | DONE | I/O | DONE | DONE | DONE | Maintain DONE pin function. |
| INITN | | | INITN | I/O | INITN | INITN | INITN | Maintain INITN function. |
| CSN | | No | Tri-State | Input | Tri-State | CSN | Tri-State | |
| CS1N | | No | Tri-State | Input | Tri-State | CS1N | Tri-State | |
| D0 | | No | Tri-State | I/O | Tri-State | D0 | Z/Speed | Speed = 0,1 selects 0x0B, 0x03. |
| D1 | | No | Tri-State | I/O | Tri-State | D1 | Z | |
| D2 | | No | Tri-State | I/O | Tri-State | D2 | Z | |
| D3 | | No | Tri-State | I/O | Tri-State | D3 | Z | |
| D4 | | No | Tri-State | I/O | Tri-State | D4 | Z | |
| D5 | | No | Tri-State | I/O | Tri-State | D5 | Z | |
| D6 | | No | Tri-State | I/O | Tri-State | D6 | Z/SPID1 | Multi task pin. |
| D7 | | No | Tri-State | I/O | Tri-State | D7 | Z/SPID0 | Multi task pin. |
| R/W | | No | Tri-State | Input | Tri-State | R/W | Tri-State | The READ/WRITEN pin. |
| BUSY | | No | Tri-State | Output | Tri-State | BUSY | SISPI | Multi task pin. |
| DI | | No | Tri-State | Input | DI | Tri-State | CSSPI0 | Multi task pin. |
| Dout | | No | Tri-State | Output | Dout | CSO | Dout | Multi task pin. |
| CFGx | | | CFGx | Input | | CFGx | | Maintain CFGx function |
| PROGRAMN | | | PROGRAMN | Input | | PROGRAMN | | Maintain PROGRAMN pin function. |

Notes:
1. The CCLK pin is no longer a dedicated sysCONFIG port pin. User are allowed to use the pin as the CCLK pin to program the SPI Flash devices through the JTAG port or through the soft-IP.
Legend:
Z = Tri-State with no pull-up.
Tri-State = Tri-State with pull-up.
BSCAN = The IO is governed by the content of the BSCAN cell.

It will be appreciated that exemplary operational characteristics of I/O blocks 102 (User IO's) and data port 112 (sysCONFIG) are provided in Table 4. In particular, in addition to SPI devices, the sysCONFIG port may be optionally configured to interface with external devices, such as non-volatile memories, supporting Serial Configuration Mode (SCM) (i.e., loading 1 bit of configuration data per programming clock cycle) or Parallel Configuration Mode (PCM) (i.e., loading 8 or more bits of configuration data per programming clock cycle), or SPI interfaces. Advantageously, by configuring a sysCONFIG port as an SPI interface, configuration data can be quickly loaded (for example, clocked at approximately 50 MHz) into configuration memory cells of a PLD faster than by using a dedicated JTAG port (for example, clocked at approximately 25 MHz).

Systems and methods are disclosed herein to provide reconfiguration techniques for PLDs. For example, in accordance with an embodiment of the present invention, techniques are disclosed to provide transparent field reconfiguration such that the PLD can be reconfigured without interrupting system operation (e.g., to provide dynamic programming of programmable devices with embedded volatile fuses (e.g., configuration SRAM) for a minimally disruptive reconfiguration solution for the PLD).

In general, many system designs, within which the PLD operates, require 99.999% up-time. For example, by using background programming and/or a sysCONFIG port, the PLD continues to operate while the external bitstream is loaded into non-volatile memory. Furthermore, by driving glitch-free known values as output signals via the I/O circuits, the PLD can provide valuable functionality to the system in which it operates, such as to continue to provide power enable, reset, or other critical signals (e.g., which may be used to bring up the system) while the PLD is reconfigured (e.g., in an on-the-fly reconfiguration procedure). Thus, techniques are disclosed herein to control the state of the logic within the PLD prior to and following the configuration process, which allows the device logic to drive the correct levels on its outputs immediately, when control of I/O is passed back to the PLD logic at the end of the configuration cycle.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
   a plurality of logic blocks;
   a plurality of input/output blocks and corresponding input/output pins, wherein the plurality of input/output pins are adapted to receive input data to store within the programmable logic device to provide a known state exit;
   a plurality of configuration memory cells adapted to store configuration data for configuration of the logic blocks and the input/output blocks;
   a data port adapted to provide a clock signal to and receive configuration data from an external memory; and
   a plurality of circuits adapted to hold the input/output pins in a known logic state during the configuration.

2. The programmable logic device of claim 1, wherein the data port is further adapted to load the configuration data to the configuration memory cells.

3. The programmable logic device of claim 1, wherein each one of the circuits comprises a latch coupled to a pullup resistor and a pulldown resistor.

4. The programmable logic device of claim 1, wherein the plurality of circuits comprises:

a plurality of bus keeper circuits; and a plurality of boundary scan cells.

5. The programmable logic device of claim 1, further comprising a soft IP core stored in the configuration memory cells and adapted to configure a JTAG port adapted to receive instructions for the circuits to hold the input/output pins in the known logic state.

6. The programmable logic device of claim 1, further comprising a dedicated JTAG port adapted to receive instructions for the circuits to hold the input/output pins in the known logic state.

7. The programmable logic device of claim 1, further comprising:

a plurality of registers within a logic area of the programmable logic device; and an input path from at least one of the input/output pins to at least one of the registers to precondition the at least one of the registers with a desired signal value.

8. The programmable logic device of claim 1, further comprising a plurality of registers, within a logic area of the programmable logic device, adapted to prevent glitches from being provided by the input/output blocks after the configuration.

9. The programmable logic device of claim 1, wherein the external memory is a flash memory.

10. The programmable logic device of claim 1, wherein the data port is configured as a serial peripheral interface (SPI) port.

11. A method of reconfiguring a programmable logic device, the method comprising:

triggering a reconfiguration of the programmable logic device while configuration memory cells of the programmable logic device are configured with configuration data;

capturing a plurality of output signal values of the programmable logic device;

providing a clock signal to an external non-volatile memory;

loading reconfiguration data into the configuration memory cells from the external non-volatile memory during the providing;

maintaining the output signal values during the loading; and performing a known state exit operation for the programmable logic device.

12. The method of claim 11, further comprising programming the external non-volatile memory with the reconfiguration data prior to the triggering.

13. The method of claim 11, wherein the capturing is performed in response to a JTAG instruction.

14. The method of claim 11, further comprising providing input data to the programmable logic device after the loading to precondition registers with the input data.

15. A system comprising:

a programmable logic device (PLD) having a plurality of configuration memory cells adapted to store configuration data;

means for storing, external to the programmable logic device, configuration data for configuring or reconfiguring the programmable logic device;

means for providing a clock signal from the programmable logic device to the storing means;

means for loading the configuration data into the configuration memory cells from the storing means based on the clock signal;

means for maintaining PLD output signal values during loading of the configuration data; and means for capturing a plurality of output signal values of the programmable logic device.

16. The system of claim 15, further comprising means for controlling the programmable logic device and the storing means for configuring or reconfiguring the programmable logic device.

17. The system of claim 15, further comprising means for programming the configuration data into the storing means.

* * * * *